US012601984B2

(12) United States Patent
Beukman et al.

(10) Patent No.: US 12,601,984 B2
(45) Date of Patent: Apr. 14, 2026

(54) METROLOGY METHOD AND APPARATUS

(71) Applicant: ASML Netherlands B.V., Veldhoven (NL)

(72) Inventors: Arjan Johannes Anton Beukman, Son en Breugel (NL); Omar El Gawhary, Veldhoven (NL); Ilse Van Weperen, Veldhoven (NL); Pieter Joseph Marie Wöltgens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 103 days.

(21) Appl. No.: 18/413,910

(22) Filed: Jan. 16, 2024

(65) Prior Publication Data

US 2024/0231247 A1 Jul. 11, 2024

Related U.S. Application Data

(63) Continuation of application No. PCT/EP2022/069165, filed on Jul. 8, 2022.

(30) Foreign Application Priority Data

Jul. 16, 2021 (EP) ..................................... 21186127

(51) Int. Cl.
*G03F 9/00* (2006.01)
(52) U.S. Cl.
CPC .......... *G03F 9/7088* (2013.01); *G03F 9/7046* (2013.01)
(58) Field of Classification Search
CPC .... G03F 9/7088; G03F 9/7046; G03F 9/7092; G03F 9/7076
See application file for complete search history.

(56) References Cited

U.S. PATENT DOCUMENTS 7,084,987 B2 * 8/2006 Kreuzer ................ G03F 9/7088
356/508
7,109,508 B2 * 9/2006 Shiraishi ............... G03F 9/7049
250/548

(Continued)

FOREIGN PATENT DOCUMENTS

CN 109581821 A 4/2019
CN 110031968 A 7/2019

(Continued)

OTHER PUBLICATIONS

PCT International Search Report, corresponding with a PCT Application No. PCT/EP2022/069165, mailed on Nov. 22, 2022. (2 page).

(Continued)

*Primary Examiner* — Hung V Nguyen
(74) *Attorney, Agent, or Firm* — Finnegan, Henderson, Farabow, Garrett & Dunner LLP

(57) ABSTRACT

Disclosed is a method for measuring alignment on an alignment mark, and associated apparatuses. The method comprises illuminating the alignment mark with illumination comprising at least one wavelength; capturing the scattered radiation scattered from the alignment mark as a result of said illumination step, and determining at least one position value for said alignment mark from an angularly resolved representation of said scattered radiation, wherein said alignment mark, or a feature thereof, is smaller than said at least one wavelength in at least one dimension of a substrate plane.

27 Claims, 4 Drawing Sheets

(56) References Cited

U.S. PATENT DOCUMENTS

| | | | |
|---|---|---|---|
| 9,835,954 | B2 | 12/2017 | Bogaart et al. |
| 12,025,925 | B2 * | 7/2024 | Alpeggiani ........... G03F 9/7046 |
| 12,032,299 | B2 * | 7/2024 | Tinnemans ......... G03F 7/70616 |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2012/0044470 | A1 | 2/2012 | Smilde et al. |
| 2012/0123581 | A1 | 5/2012 | Smilde et al. |
| 2013/0258310 | A1 | 10/2013 | Smilde et al. |
| 2013/0271740 | A1 | 10/2013 | Quintanilha |
| 2016/0061590 | A1 | 3/2016 | Pandey |
| 2020/0103772 | A1 | 4/2020 | Goorden et al. |

FOREIGN PATENT DOCUMENTS

| | | | |
|---|---|---|---|
| EP | 1372040 | B1 | 12/2003 |
| TW | I714617 | B | 1/2021 |
| WO | WO 2009/078708 | A1 | 6/2009 |
| WO | WO 2009/106279 | A1 | 9/2009 |
| WO | WO 2013/178422 | A1 | 12/2013 |

OTHER PUBLICATIONS

Kumar, et al., "Coherent Fourier Scatterometry (Tool for improved sensitivity in semiconductor metrology)," Proc. of SPIE vol. 8324, 83240Q, Downloaded from SPIE Digital Library on Apr. 13, 2012 to 145.94.168.119. (9 pages).

Lai, et al., "Study of Alignment & Overlay Strategy in 14 NM Lithography Process," Shanghai Huali Integrated Circuit Corporation, Shanghai, China, Downloaded on Jun. 2, 2021 at 12:10:23 UTC from IEEE Xplore (3 pages).

Kumar, et al., "Coherent Fourier Scatterometry," printed in Netherlands by Ipskamp Drukkers, Enschede, 2014, http://repository.tudelft.nl(150 pages).

Roy, et al., "Exploiting evanescent-wave amplification for subwavelength low-contrast particle detection," the School of Physics, Nankai University, Tianjin 300071, China, s.f.pereira@tudelft.nl, DOI: 10.1103/PhysRevA.96.013814 (5 pages).

Roy, et al., "Radially Polarized Light for Detection and Nanolocalization of Dielectric Particles on a Planar Substrate," 2015 American Physical Society, DOI: 10.1103/PhysRevLett.114.103903 (5 pages).

* cited by examiner

METROLOGY METHOD AND APPARATUS

CROSS-REFERENCE TO RELATED APPLICATIONS

This application claims priority of International application PCT/EP2022/069165, filed on 8 Jul. 2022, which claims priority of EP application 21186127.3, filed on 16 Jul. 2021. These applications are incorporated herein by reference in their entireties.

FIELD

The embodiments of the present disclosure relate to methods and apparatus usable, for example, in the manufacture of devices by lithographic techniques, and to methods of manufacturing devices using lithographic techniques, and more particularly to metrology sensors, such as position sensors.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A. US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

It is increasingly desirable to be able to measure smaller alignment marks than is presently possible. One main advantage of smaller alignment marks is that they take up less room on the reticle and/or substrate and therefore may be accommodated within the device structure rather than a scribe lane. This means that they are closer to the actual structures being measured, and are also closer to the same dimensions as the device structures, which in both cases can increase accuracy of the alignment measurements.

SUMMARY

The embodiments of the present disclosure provide a method for measuring alignment on an alignment mark, the method comprising: illuminating said alignment mark with illumination comprising at least one wavelength; capturing the scattered radiation scattered from the alignment mark as a result of said illumination step; and determining at least one position value for said alignment mark from an angularly resolved representation of said scattered radiation, wherein said alignment mark, or a feature thereof, is smaller than said at least one wavelength in at least one dimension of a substrate plane.

The embodiments of the present disclosure provide a substrate comprising an alignment mark arrangement, wherein the alignment mark arrangement comprises an alignment mark is smaller than 500 nm in at least dimension of a substrate plane.

The embodiments of the present disclosure provide a reticle for producing the substrate described above, comprising product forming features arranged to produce said alignment mark arrangement on the substrate.

The embodiments of the present disclosure provide a coherent Fourier scatterometer being operable to perform the method of the first aspect.

The above and other aspects of the invention will be understood from a consideration of the examples described below.

BRIEF DESCRIPTION OF THE DRAWINGS

Embodiments will now be described, by way of example only, with reference to the accompanying drawings, in which.

DETAILED DESCRIPTION

Before describing embodiments of the present disclosure in detail, it is instructive to present an example environment in which embodiments of the present disclosure may be implemented.

Figure 1:
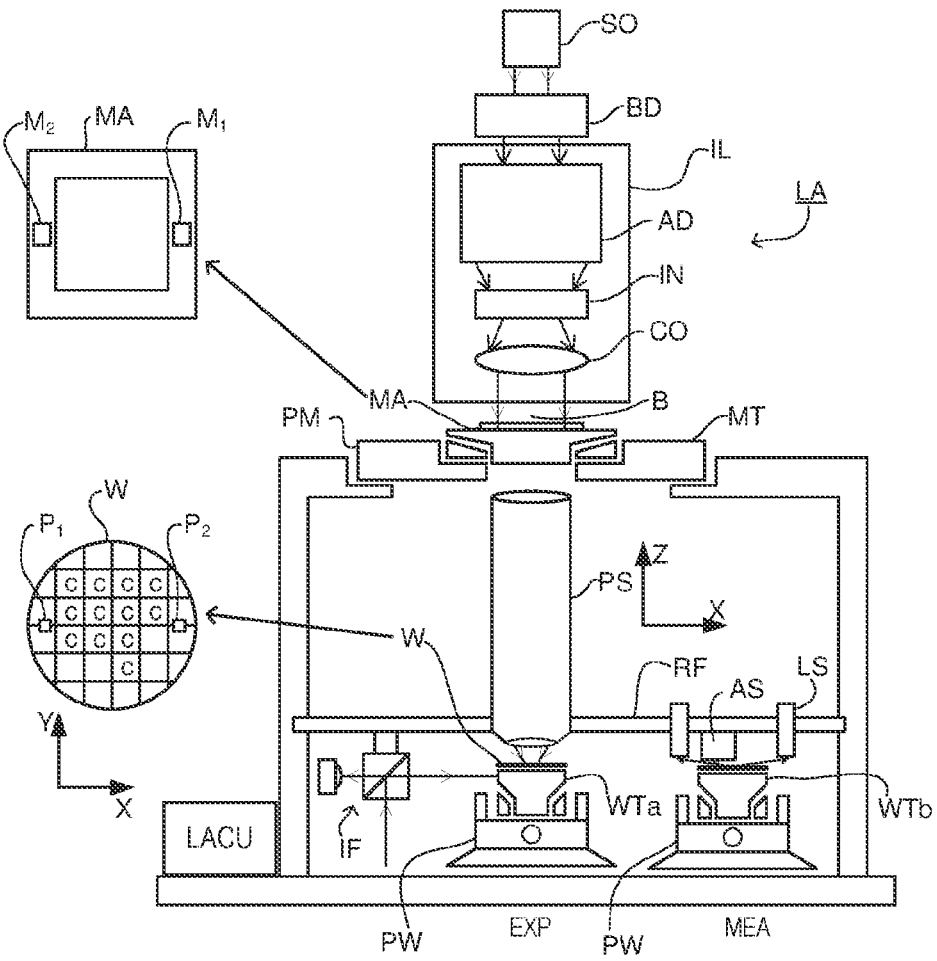
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
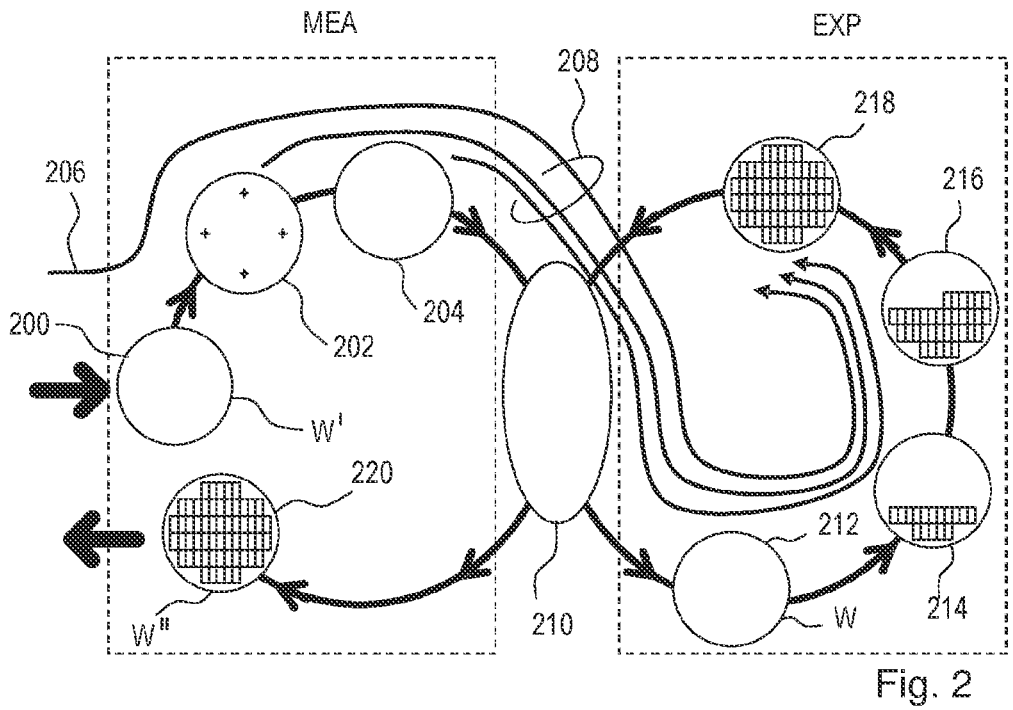
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one example to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Current and even proposed future alignment marks (e.g., of the order of 10s of microns) are too large to place in-die. To improve wafer alignment accuracy, it is desirable to be able to place alignment marks inside the die, in close vicinity of the product. It is also desirable that the size of the marks are similar (e.g., of the same order) as product features, thereby reducing mark-to-device (MTD) offset. The MTD offset is a measure of the difference between a position measurement taken from an alignment mark with respect to the actual position of a product feature the mark is meant to represent. As such, an alignment mark may have a different shift to nominal than one or more surrounding product features. The effect is caused by the presence of one or more product features having a significantly smaller pitch (i.e. feature width or spacing between features) than the alignment mark, and therefore exposure radiation travels through a different part of the projection system. It is also very desirable for in-die alignment marks to be small, as the marks take up space in potentially yielding wafer area.

Furthermore, small marks in general are desirable because they take up less area in scribe lane, allowing placement of more marks in the scribe lane without occupying more area and/or allowing other features to be placed there.

However, reducing mark sizes to very small proportions based on present alignment sensor technologies and alignment mark technologies is difficult because of the signal detectability (low signal-to-noise) in the allowed alignment time.

In addition, present periodic structures used for alignment marks have dimensions that are much larger than critical product features. It is however preferred to print only features with dimensions similar to product features.

To address the issues discussed, an alignment sensor concept based on Coherent Fourier Scatterometry (CFS) that can align on ultra-small alignment marks is proposed.

An ultra-small alignment mark in this context may comprise a target which is smaller than wavelength of the measurement illumination in at least one dimension of a substrate plane. A ratio of wavelength to a length of said target in said at least one dimension may be, for example, smaller than 40:3 and/or larger than 2:1.

The alignment mark may have one or both dimensions in the substrate plane smaller than 500 nm, smaller than 400 nm, smaller than 300 nm, smaller than 200 nm, smaller than 150 nm or smaller than 100 nm, for example.

The alignment mark may be surrounded by a contrasting region; the contrasting region may have both dimensions in the substrate plane smaller than 10 μm, smaller than 5 μm, smaller than 4 μm, smaller than 3 μm or smaller than 2 μm.

Also disclosed is a substrate comprising an alignment mark arrangement comprising an ultra-small alignment mark and contrasting region, and a reticle for exposing such an alignment mark arrangement on a substrate.

Coherent Fourier Scatterometry (CFS) is a technique that can be used to detect small particles (e.g., down to ~30 nm) using spatially coherent light. The wavelength of the spatially coherent light may be in the region of 400 nm (e.g., between 100 nm and 900 nm). The concept of CFS metrology in the context of semiconductor metrology is described, for example, in *Coherent Fourier Scatterometry* (*Tool for improved sensitivity in semiconductor metrology*), Kumar, N et. al.; Proceedings of SPIE Vol. 8324—The International Society for Optical Engineering; February 2012; which is hereby incorporated by reference.

Figure 3:
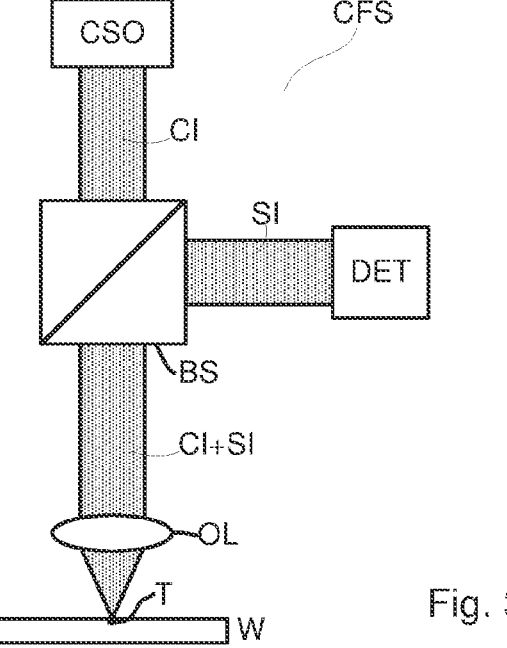
FIG. 3 illustrates schematically a coherent Fourier scatterometry apparatus usable for alignment methods according to some embodiments of the present disclosure.

A CFS apparatus usable for performing the methods disclosed herein is illustrated in FIG. 3. A coherent source CSO, such as a laser, provides coherent illumination CI. This propagates through beamsplitter BS and is scanned on the substrate or wafer W via objective lens OL. A target T on the wafer W results in scattering of the coherent illumination CI. The scattered illumination SI is captured by the objective lens OL, the scattered illumination including the specular reflection (zeroth order). The beamsplitter BS directs the scattered radiation SI to a balanced detector or differential detector DET. The balanced detector DET is located in a pupil plane of the objective lens OL or conjugate thereof, and measures asymmetry in the detected pupil (e.g., an angularly resolved intensity spectrum). The presence of the target T redistributes the light in the pupil plane and a balanced detector DET in the pupil plane can record this redistribution.

The CFS tool may have a high-NA objective to enable the sub-wavelength sensitivity The NA may be 0.9 or higher, 0.8 or higher, 07 or higher or 0.6 or higher.

This technique is more sensitive than conventional (incoherent) brightfield and darkfield metrology techniques because of 'interferometric amplification' with the zeroth order. As such, the concepts herein relate to using the interferometric amplification of CFS for alignment. Signal-to-noise is expected to be boosted compared to conventional (incoherent) bright-field and dark field techniques. The strong zeroth order interferes with the weak scattered light and amplifies it.

To measure such small alignment marks using a CFS tool, it is proposed that each ultra-small alignment mark comprises a single small square, rectangular, circular, line (e.g., a line oriented parallel with each measurement direction, possibly crossed) or any other shape which is symmetrical in the relevant measurement direction(s); i.e., symmetrical in x for alignment in x and/or symmetrical in y for alignment in y where x and y are the two perpendicular directions of the substrate plane. The ultra-small alignment marks may have a maximum size (i.e., at a widest point) no larger than 500 nm, 400 nm, 300 nm, 200 nm, 100 nm, 50 nm, 40 nm or 30 nm in one or both of the substrate dimensions.

Due to the practical minimum size of the measurement spot of a CFS tool being approximately 1 μm (0.9NA) in some embodiments, it is further proposed that an area or region surrounding each ultra-small alignment mark comprises no product structure. Such a region may comprise a contrasting region which contrasts with the alignment mark. This region may be smaller than 10 μm, smaller than 5 μm, smaller than 4 μm, smaller than 3 μm or smaller than 2 μm in each substrate plane dimension. For example, where the mark is an exposed mark or structure, the contrasting region may be empty, comprising no structure. Alternatively, the alignment mark may comprise a small empty region surrounded by (e.g., non-functional or dummy) exposed structure, such as regular/periodic structure or "sub-segmentation".

Figures 4A, 4B, 4C, 4D, 4E, 4F, 4G:
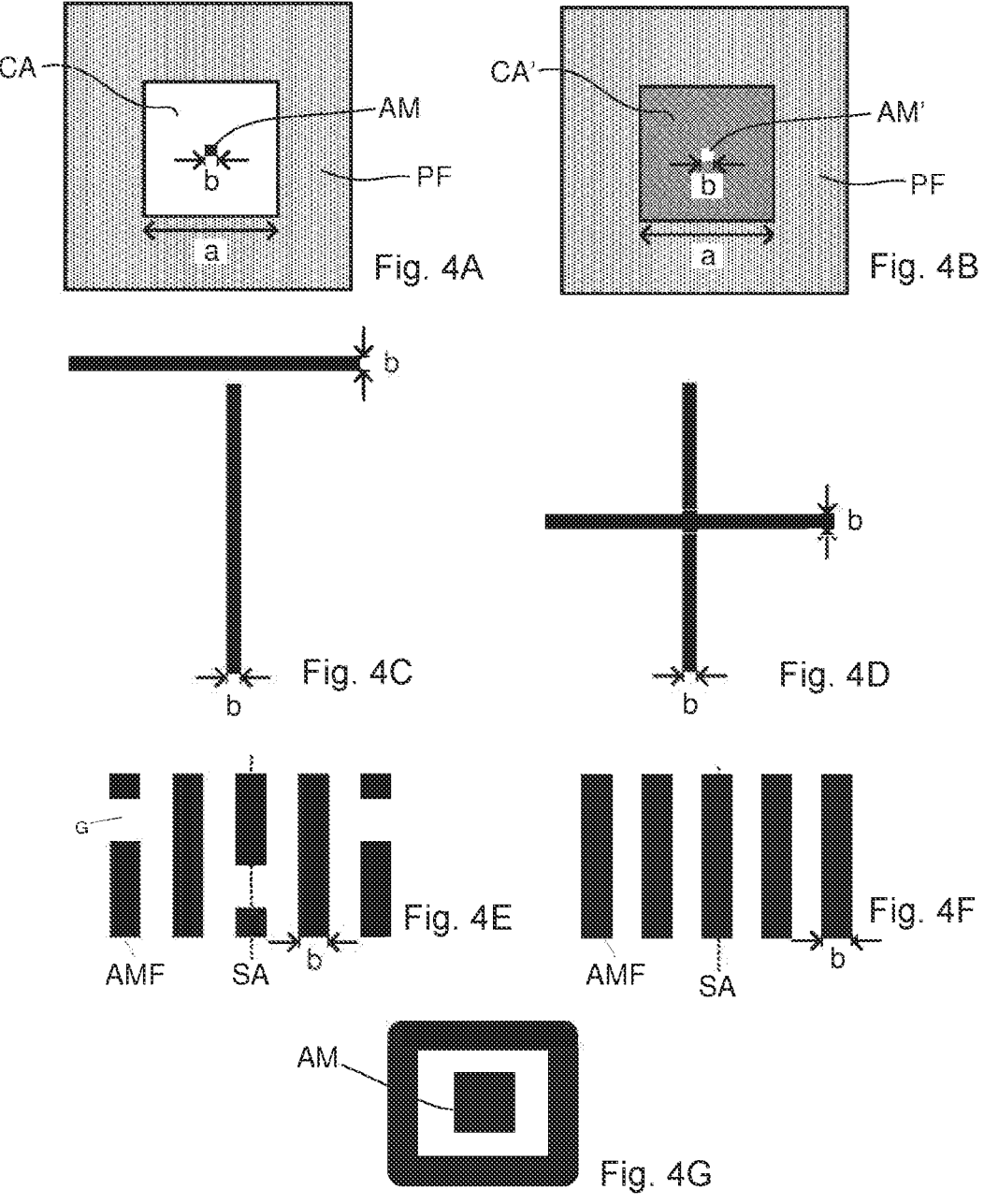
FIGS. 4A, 4B, 4C, 4D, 4E, 4F, and 4G illustrate respectively a first ultra-small alignment mark, a second ultra-small alignment mark, a third ultra-small alignment mark, a fourth ultra-small alignment mark, a fifth ultra-small alignment mark, a sixth ultra-small alignment mark and a seventh ultra-small alignment mark.

FIGS. 4A, 4B, 4C, 4D, 4E, 4F, and 4G illustrate seven example ultra-small alignment marks. FIG. 4A shows a first ultra-small alignment mark AM comprising an etched (e.g., formed in a previous layer by exposure and etch) square of dimension b, where b may be smaller than 500 nm, smaller than 300 nm, smaller than 200 nm, smaller than 150 nm, smaller than 100 nm smaller than 50 nm, smaller than 40 nm or smaller than 30 nm for example. In a specific example, dimension b may be approximately 100 nm. The ultra-small alignment mark AM is surrounded by a contrasting area or contrasting region CA of dimension a, which in this example may be empty (i.e., comprises no exposed structure).

Dimension a may be, for example, 2 μm. Around the contrasting region CA is the actual product features or product structure PF, where the target is located in-die (it can be located within the scribe lane).

FIG. 4B illustrates a second ultra-small alignment mark AM', which can be thought of as a "negative" variation of the "positive" ultra-small alignment mark AM of FIG. 4A. The difference in this example is that contrasting region CA' may comprise dummy structure or sub-segmentation, while the second ultra-small alignment mark AM' is a small empty region or "hole" inside of the contrasting region CA. This hole will behave similarly to the "positive" first ultra-small alignment mark AM of FIG. 4A. Dimensions a and b may be the same for both of these mark types.

FIG. 4C shows a line or bar type ultra-small alignment mark, which is ultra-small in only one dimension (per bar). As such, dimension b, may be smaller than the illumination wavelengths, and for a specific example, may be smaller than 500 nm, smaller than 300 nm, smaller than 200 nm, smaller than 150 nm, smaller than 100 nm, smaller than 50 nm, smaller than 40 nm or smaller than 30 nm. In a specific example, dimension b may be approximately 100 nm. The other dimension may be much larger, e.g., on the order of microns. Two such bars may be provided, one per (i.e., oriented along) a measurement direction. FIG. 4D is a cross shaped mark employing the same principles as the mark of FIG. 4C. The advantage of such marks is that they remove sensitivity to the lateral scan offset (for example, the vertical bar can be scanned in x-direction at different y-positions). Also, the signal to noise ratio will be larger than those of FIGS. 4A and 4B and they are robust to scanning off-center.

Product features are often made up of lines; as such it may even be possible to align directly on product features (e.g., both within-die and on-product). This means that no dedicated alignment marks are required (or their number reduced) and the yielding area can be larger. As such, the term alignment mark within the context of this disclosure includes product features/structures being used for alignment.

FIG. 4E is a proposed ultra-small alignment mark comprising a plurality of ultra-small alignment mark features AMF, where at least one of the alignment mark features AMF is broken; i.e., the alignment mark comprises at least one gap G in at least one of its features AMF.

Process variations and/or random damage during processing may impact the aligned position extracted from isolated at-resolution alignment marks such as illustrated in FIG. 4A to 4D. As such, the use of a more extended alignment structure comprising at-resolution features (e.g., features having dimensions as already defined), may be more robust to processing impact. Moreover, for devices which comprise dense features (instead of isolated features), dense at-resolution alignment marks may provide more accurate aligned positions. Therefore it may be desirable to be able to use dense or at least denser alignment marks; i.e., multiple at-resolution structures closely grouped together, for alignment using the CFS alignment tool.

However, the proposed size of the at-resolution features is smaller than the wavelength of light used in the CFS-alignment tool, and therefore a standard alignment mark arrangement, such as a standard periodic grating having many features (many repetitions of features) and no gaps/broken features, will not work. This is because, with the light frequency being much larger than the feature width (labeled b, where b may be as already defined above), the first order diffraction modes are evanescent modes rather than propagating ones, and will therefore not exit the sample and reach the objective. The spacing of the features may also be at-resolution, e.g., smaller than 500 nm, smaller than 300 nm, smaller than 200 nm, smaller than 150 nm, smaller than 100 nm, smaller than 50 nm, smaller than 40 nm or smaller than 30 nm. The line-space ratio may be 1:1, but this is not necessary or critical.

In the example of FIG. 4E the gaps G in the proposed alignment mark breaks the grating regularity. The gaps can be seen as negative small alignment features (similar in principle to the alignment mark AM' of FIG. 4B) and result in a signal propagating back to the objective. The number of features for such a proposed alignment mark is not important and may comprise any number.

FIG. 4F is an alternative proposal to that of FIG. 4E, which addresses the same issue as that of FIG. 4E. In this alignment mark, none of the alignment features are broken; however in this specific example the number of features of such an alignment mark is small; e.g., fewer than 10, fewer than 8, fewer than 6 or fewer than 4. As such, the alignment mark may comprise 3, 5, 7 or 9 such features. If the alignment mark features comprises no gaps, as grating lines are added, they start to cancel each other's scattering field which therefore reduces the signal strength. Limiting the number of features prevents this.

It may be appreciated that some device layer arrangements (e.g. gate, fin layer) contain structures similar to the alignment marks of FIG. 4E or 4F. Therefore, it may be possible to configure the alignment marks to closely resemble (e.g., mimic) actual product structures. It may also be possible to directly align onto the product structure. To actually allow on-device alignment, a way should be found to deal with the variations in the device structures (e.g., which remove symmetry).

The paper 'Exploiting evanescent-wave amplification for subwavelength low-contrast particle detection' (PRA 96, 013814 (2017)) considers the mechanism of scattering of coherent light incident on a particle. In particular, it found that a layer deposited onto the sample surface may enhance the effective backscattering. The sensitivity of the CFS-alignment tool can in this way be improved. Depositing such an enhancement layer is however generally not feasible in IC-industry conditions.

FIG. 4G illustrates a method for exploiting this amplification or enhancement without requiring an additional layer to be deposited on the sample surface. Such an approach may comprise defining auxiliary features partially or completely around the ultra-small alignment mark AM, e.g., where the alignment mark may be similar to that of FIG. 4A for example. The auxiliary features AF may, for example, be comprised in the contrasting area CA or otherwise empty area around the ultra-small alignment mark.

The auxiliary features AF can completely surround the ultra-small alignment mark AM, e.g., in one or more (e.g., concentric) rings (not necessarily circular) such as illustrated in FIG. 4G. Only one ring of auxiliary features AF is shown in the figure, although more rings may bring additional enhancement, e.g., scattering into the far-field.

The auxiliary features AF may also comprise alignment structures or alignment marks such as illustrated in FIG. 4E or 4F. The distance between mark and (e.g., first) auxiliary feature may be between 10 nm and 100 nm, between 10 nm and 50 nm between 20 nm and 50 nm or between 20 nm and 40 nm for example. The auxiliary feature thickness (e.g., per ring) may be between 5 nm and 40 nm or between 10 nm and 20 nm.

The proposed CFS alignment technique, where aligned position can be extracted based only on measurements (that is, without comparison to simulation results), is based on there being an axis of symmetry SA in the alignment mark which is perpendicular to the scanning direction. As such, each of the alignment marks 4(a) to 4(g) comprises such an axis of symmetry (labeled only on FIGS. 4(c) and 4(f)).

Figure 5:
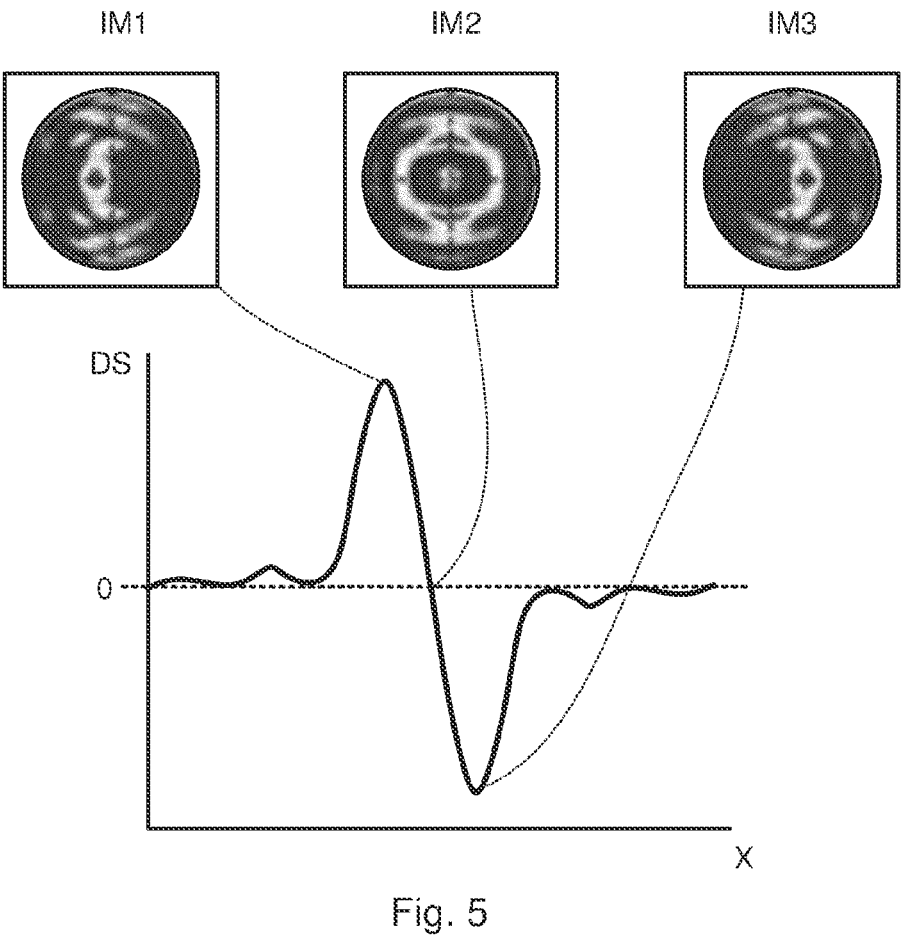
FIG. 5 illustrates is a plot of balanced signal verses scan position indicating how an aligned position may be determined from an ultra-small alignment mark such as illustrated in FIG. 4A or FIG. 4B.

FIG. 5 illustrates how an aligned position may be determined from such an ultra-small alignment mark. The CFS tool, using spatially coherent light, scans across the mark and measures the difference in intensity between the left half and right half of the pupil, e.g., using a balanced detector. The plot in FIG. 5 is a plot of the differential or balanced signal DS against scanning position X. As a function of (scanning) position, an S-shaped signal is observed having a zero-crossing at the center of the mark or the symmetry point of the mark. Three pupil images IM1, IM2, IM3 as may be captured on the detector is shown, corresponding to a positive peak, mark center and negative peak respectively. The aligned position is obtained from the zero-crossing of this plot.

A single such ultra-small alignment mark can be used to measure both x and y-position (i.e., alignment in both directions of the substrate plane). To do this, the alignment mark should be symmetrical in x and y.

Figure 6:
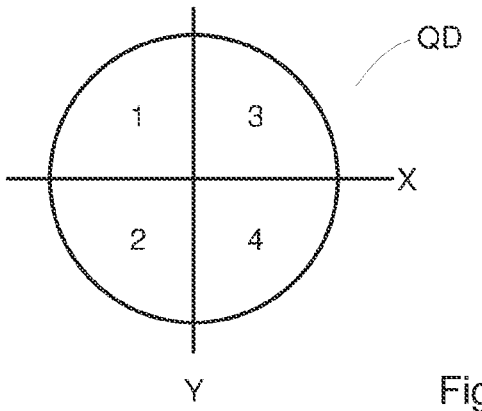
FIG. 6 is an illustration of a quadrant detector allowing position determination in x and y from the same mark.

To implement dual-direction alignment, a quadrant detector may be used as a variant on the balanced detector. FIG. 6 illustrates the concept of such a quadrant detector QD, which separates the detected pupil into four quadrants (numbered 1-4), Such an arrangement allows for scanning in x and y without rotating the wafer (i.e., by scanning the measurement beam over the alignment mark in a direction oblique to x and y; i.e., a direction other than parallel to x or y). The differential or balanced signal may be determined from one or a number of arbitrary combinations of these quadrants, e.g., a first combination for detection in x and a (different) second combination for detection in y, where a combination comprises a difference of a first sum of two quadrants and a second sum of the other two quadrants. For example, a combination of (1+3)-(2+4) (i.e., the difference of: the sum of quadrants 1 and 3 and the sum of quadrants 2 and 4) may be used to detect alignment in y, and a combination of (1+2)-(3+4) (i.e., the difference of: the sum of quadrants 1 and 2 and the sum of quadrants 3 and 4) may be used to detect alignment in x. It is optionally possible to apply a weighting to each quadrant to correct for any measurement errors; e.g., purely by way of a specific 70% quadrant 1+90% quadrant 2-10% quadrant 3-15% quadrant 4).

It is possible to parallelize the alignment setup such that multiple marks are scanned simultaneously. To do this, the multiple measurement beams may be generated, each one configured to measure a different mark on the wafer simultaneously. The signal from each mark may be separately detected (on a single detector or a detector per mark) and processed to obtain a position per mark. Therefore, each mark can be measured longer, thereby further increasing signal-to-noise ratio. Alternatively or in addition measurement time may be reduced.

It is often desirable to measure using multiple colors and/or polarizations. The concepts disclosed herein can be easily extended to use parallel colors. One way is to implement this is to measure multiple colors and polarizations sequentially, where the input radiation is adjusted (in color and/or polarization) before each measurement. Another such method illuminates the target with all desired colors and polarizations in parallel and collects all the resultant scattered light. Subsequent to this, suitable optical elements such as dichroic (or polarization) mirrors may be used to guide each color (and/or polarization) to a separate (quadrant) detector. Combinations of these two methods are also possible, where for instance polarization is measured in parallel and colors sequentially, or some colors are measured in parallel with a different color set measured in sequential snapshot.

Compared to current 30×30 $\mu m^2$ alignment marks, a reduction in alignment mark area (including the contrasting region) by a factor 200 may be realized by using the concepts disclosed herein. In this estimate, a scan area of approximately 2×2 $\mu m^2$ is assumed for the alignment mark area. There is also a better match of alignment mark size with product feature size. The use of a large illumination NA allows a small spot and thus a small alignment mark area, and the use of a large detection NA allows all captured light to contribute to the signal, leading to a large signal-to-noise ratio.

The relatively low incident light intensity may be used (compared to dark-field), which reduces the chance of wafer damage. In this respect, it should be noted that reducing the spot size using a conventional detector, means that the light intensity needs to be raised to obtain the same number of photons on the detector. Thus, for smaller area alignment concepts (assuming spot size similar to mark size) wafer damage increasingly becomes a concern.

The CFS tool may use cheap detectors (e.g., photodiode-based) and may be a potentially cheaper alignment sensor due to its simplicity.

While specific embodiments of the present disclosure have been described above, it will be appreciated that the invention may be practiced otherwise than as described.

Although specific reference may have been made above to the use of embodiments of the present disclosure in the context of optical lithography, it will be appreciated that the embodiments of the present disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

Embodiments of the present disclosure can be further described by the following clauses.

1. A method for measuring alignment on an alignment mark, the method comprising:
    illuminating said alignment mark with illumination comprising at least one wavelength;
    capturing the scattered radiation scattered from the alignment mark as a result of said illumination step; and
    determining at least one position value for said alignment mark from an angularly resolved representation of said scattered radiation;
    wherein said alignment mark, or a feature thereof, is smaller than said at least one wavelength in at least one dimension of a substrate plane.

2. A method as in clause 1, wherein said illumination comprises coherent illumination.

3. A method as in clause 1 or 2, wherein said determining at least one position value comprises determining the at least one position value from measurement of balance or symmetry in said angularly resolved representation.

4. A method as in any preceding clause, comprising:
    scanning said illumination over said alignment mark, and determining the at least one position value from a zero crossing of an alignment signal determined from said angularly resolved representation.

5. A method as in any of clauses 1 to 3, wherein said determining at least one position value comprises determining a first position value for a first dimension of the substrate plane and a second position value for a second dimension of the substrate plane.

6. A method as in clause 5, comprising:
    scanning said illumination obliquely over said alignment mark;
    determining said first position value from a zero crossing of a first alignment signal determined from said angularly resolved representation; and determining said second position value from a zero crossing of a second alignment signal determined from said angularly resolved representation.

7. A method as in clause 5, wherein said first alignment signal is determined from a first combination of quadrants of said angularly resolved representation and said second alignment signal is determined from a second combination of quadrants of said angularly resolved representation.

8. A method as in clause 7, wherein each of said first combination and second combination comprises a difference of a first sum of two of said quadrants and a second sum of the other two of said quadrants.

9. A method as in any preceding clause, wherein said scattered radiation includes a zeroth order component specularly reflected from the alignment mark.

10. A method as in any preceding clause, wherein a ratio of said wavelength to said length of said alignment mark in said at least one dimension is smaller than 40:3.

11. A method as in any preceding clause, wherein a ratio of said wavelength to said length of said alignment mark in said at least one dimension is greater than 2:1.

12. A method as in any preceding clause, wherein the alignment mark, or a feature thereof, is smaller than 500 nm in one or both dimensions of the substrate plane.

13. A method as in any preceding clause, wherein the alignment mark, or a feature thereof, is smaller than 200 nm in one or both dimensions of the substrate plane.

14. A method as in any preceding clause, wherein the alignment mark, or a feature thereof, is smaller than 150 nm in one or both dimensions of the substrate plane.

15. A method as in any preceding clause, wherein the alignment mark is a functional product structure.

16. A method as in any of clauses 1 to 14, wherein the alignment mark is surrounded by a contrasting region, said contrasting region optically contrasting said alignment mark.

17. A method as in clause 16, wherein the contrasting region is smaller than 10 μm in each dimension of the substrate plane.

18. A method as in clause 16, wherein the contrasting region is smaller than 5 μm in each dimension of the substrate plane.

19. A method as in clause 16, wherein the contrasting region is smaller than 2.5 μm in each dimension of the substrate plane.

20. A method as in any of clauses 16 to 19, wherein the alignment mark comprises a structure.

21. A method as in clause 20, wherein the contrasting region is an empty region.

22. A method as in any of clauses 16 to 19, wherein the alignment mark is an empty region.

23. A method as in clause 22, wherein the contrasting region comprises exposed dummy structure.

24. A method as in any preceding clause, wherein the alignment mark is partially or completely surrounded by auxiliary features.

25. A method as in clause 24, wherein the auxiliary features are arranged in one or more rings around the alignment mark.

26. A method as in clause 24 or 25, where a distance between the alignment mark and the auxiliary features is between 20 nm and 40 nm and/or a thickness of the auxiliary feature thickness is between 10 nm and 20 nm.

27. A method as in any preceding clause, wherein the alignment mark comprises a single feature or a single feature per direction of the substrate plane.

28. A method as in any preceding clause, wherein the alignment mark comprises a square or circle shape.

29. A method as in any preceding clause, wherein said target is smaller than said wavelength in both dimensions of the substrate plane.

30. A method as in any of clauses 1 to 27, wherein the alignment mark comprises a line, or a pair of orthogonal lines.

31. A method as in clause 30, comprising said pair of orthogonal lines, wherein said pair of orthogonal lines comprises a crossed pair of orthogonal lines.

32. A method as in any of clauses 1 to 26, wherein the alignment mark comprises a periodic alignment mark comprising repetitions of features, wherein each feature is smaller than said wavelength in at least one dimension of the substrate plane.

33. A method as in clause 32, wherein one or more features of the alignment mark comprise broken features having one or more gaps.

34. A method as in clause 32 or 33, comprising fewer than 10 of said features.

35. A method as in clause 32 or 33, comprising fewer than 6 of said features.

36. A method as in any of clauses 32 to 35, wherein the alignment mark mimics actual product structure.

37. A method as in any preceding clause, wherein said alignment mark is symmetrical in at least one dimension of the substrate plane.

38. A method as in any preceding clause, wherein the alignment mark is located within-die.

39. A method as in any preceding clause, wherein said at least one dimension of the alignment mark is no more than two orders of magnitude different to a critical dimension of product structure on a same substrate as said alignment mark.

40. A method as in any preceding clause, wherein said at least one dimension of the alignment mark is of the same order of magnitude as a critical dimension of product structure on a same substrate as said alignment mark.

41. A method as in any preceding clause, wherein the scattered radiation is captured within a numerical aperture greater than 0.6.

42. A method as in any preceding clause, wherein the scattered radiation is captured within a numerical aperture greater than 0.8.

43. A method as in any preceding clause, comprising capturing said angularly resolved representation in a pupil plane or conjugate thereof, of an objective lens used to capture said scattered radiation.

44. A method as in any preceding clause, comprising measuring a plurality of said alignment marks simultaneously.

45. A method as in clause 44. comprising illuminating each of said alignment marks with a respective beam of said measurement illumination; and capturing and processing respective scattered radiation from each alignment mark to determine a respective position value.

46. A method as in any preceding clause, wherein said illumination comprises multiple wavelengths and/or polarizations.

47. A coherent Fourier scatterometer being operable to perform the method of any of clauses 1 to 46.

48. A coherent Fourier scatterometer as in clause 47 comprising a balanced detector for detecting said angularly resolved representation.

49. A coherent Fourier scatterometer as in clause 47 or 48, comprising a coherent radiation source for providing said illumination.

50. An alignment sensor configured to perform the method of any of clauses 1-46.

51. A lithographic apparatus comprising the alignment sensor as in clause 50.

The breadth and scope of the present invention should not be limited by any of the above-described exemplary embodiments, but should be defined only in accordance with the following claims and their equivalents.

The invention claimed is:

1. A method for measuring alignment on an alignment mark, the method comprising:

illuminating the alignment mark with illumination comprising at least one wavelength, wherein the illumination comprises coherent illumination;

capturing scattered radiation scattered from the alignment mark as a result of the illumination, wherein the scattered radiation, includes a zeroth order component and is directed to a balanced detector or differential detector; and determining at least one position value for the alignment mark from an angle-resolved scatterometry measurement using the scattered radiation;

wherein the alignment mark, or a feature thereof, is smaller than the at least one wavelength in at least one dimension of a substrate plane.

2. The method as claimed in claim 1, wherein the determining at least one position value comprises determining the at least one position value from measurement of balance or symmetry in the angle-resolved scatterometry measurement.

3. The method as of claim 1, further comprising:

scanning the illumination over the alignment mark, and determining the at least one position value from a zero crossing of an alignment signal determined from the angle-resolved scatterometry measurement.

4. The method of claim 1, wherein the determining at least one position value comprises determining a first position value for a first dimension of the substrate plane and a second position value for a second dimension of the substrate plane.

5. The method of claim 4, further comprising:

scanning the illumination obliquely over the alignment mark;

determining the first position value from a zero crossing of a first alignment signal determined from the angle-resolved scatterometry measurement; and determining the second position value from a zero crossing of a second alignment signal determined from the angle-resolved scatterometry measurement.

6. The method of claim 5, wherein the first alignment signal is determined from a first combination of quadrants of the angle-resolved scatterometry measurement and the second alignment signal is determined from a second combination of quadrants of the angle-resolved scatterometry measurement.

7. The method of claim 1, wherein the alignment mark is a functional product structure.

8. The method of claim 1, wherein the alignment mark is surrounded by a contrasting region, the contrasting region optically contrasting the alignment mark.

9. The method of claim 8, wherein the alignment mark comprises a structure.

10. The method of claim 9, wherein the contrasting region is an empty region.

11. The method of claim 8, wherein the alignment mark is an empty region.

12. The method of claim 11, wherein the contrasting region comprises exposed dummy structure.

13. The method of claim 1, wherein the alignment mark is partially or completely surrounded by auxiliary features.

14. The method of claim 1, wherein a target is smaller than the wavelength in both dimensions of the substrate plane.

15. The method of claim 1, wherein the alignment mark comprises a line, or a pair of orthogonal lines.

16. The method of claim 1, wherein the alignment mark comprises a periodic alignment mark comprising repetitions of features, wherein each feature is smaller than the wavelength in at least one dimension of the substrate plane.

17. The method of claim 16, wherein one or more features of the alignment mark comprise broken features having one or more gaps.

18. The method of claim 16, wherein the alignment mark mimics actual product structure.

19. The method of claim 1, wherein the alignment mark is symmetrical in at least one dimension of the substrate plane.

20. The method of claim 1, wherein the alignment mark is located within-die.

21. The method of claim 1, wherein the at least one dimension of the alignment mark is no more than two orders of magnitude different to a critical dimension of product structure on a same substrate as the alignment mark.

22. The method of claim 1, wherein the at least one dimension of the alignment mark is of the same order of magnitude as a critical dimension of product structure on a same substrate as the alignment mark.

23. The method of claim 1, further comprising measuring a plurality of the alignment marks simultaneously.

24. The method of claim 23, further comprising illuminating each of the alignment marks with a respective beam of the illumination; and capturing and processing respective scattered radiation from each alignment mark to determine a respective position value.

25. A coherent Fourier scatterometer being operable to perform the method of claim 1.

26. An alignment sensor configured to perform the method of claim 1.

27. A lithographic apparatus comprising the alignment sensor of claim 26.

* * * * *